United States Patent
Miyamae et al.

(10) Patent No.: US 9,595,601 B2
(45) Date of Patent: Mar. 14, 2017

(54) METHOD OF FABRICATING THIN-FILM SEMICONDUCTOR SUBSTRATE

(71) Applicant: JOLED INC., Tokyo (JP)

(72) Inventors: Yuichiro Miyamae, Osaka (JP); Kenichirou Nishida, Hyogo (JP); Toru Saito, Tokyo (JP)

(73) Assignee: JOLED, INC., Tokyo (JP)

( * ) Notice: Subject to any disclaimer, the term of this patent is extended or adjusted under 35 U.S.C. 154(b) by 0 days.

(21) Appl. No.: 14/956,830

(22) Filed: Dec. 2, 2015

(65) Prior Publication Data
US 2016/0163838 A1 Jun. 9, 2016

(30) Foreign Application Priority Data
Dec. 3, 2014 (JP) ................. 2014-245393

(51) Int. Cl.
| | | |
|---|---|---|
| *H01L 29/78* | (2006.01) | |
| *H01L 29/66* | (2006.01) | |
| *H01L 29/786* | (2006.01) | |
| *H01L 21/4763* | (2006.01) | |
| *H01L 21/02* | (2006.01) | |
| *H01L 27/12* | (2006.01) | |

(52) U.S. Cl.
CPC .. *H01L 29/66969* (2013.01); *H01L 21/02164* (2013.01); *H01L 21/47635* (2013.01); *H01L 27/124* (2013.01); *H01L 29/7869* (2013.01)

(58) Field of Classification Search
None
See application file for complete search history.

(56) References Cited

U.S. PATENT DOCUMENTS

| | | |
|---|---|---|
| 7,745,937 B2 | 6/2010 | Usami et al. |
| 7,858,519 B2 | 12/2010 | Liu et al. |
| 8,344,509 B2 | 1/2013 | Hayashi et al. |
| 8,536,706 B2 | 9/2013 | Hayashi et al. |
| 2004/0097075 A1* | 5/2004 | Bradshaw ......... H01L 21/76814 438/687 |

(Continued)

FOREIGN PATENT DOCUMENTS

| | | |
|---|---|---|
| JP | 09-321045 | 12/1997 |
| JP | 2006-237257 | 9/2006 |

(Continued)

OTHER PUBLICATIONS

U.S. Appl. No. 14/895,545 to Hiroshi Hayashi et al., which was filed Dec. 3, 2015.

*Primary Examiner* — Charles Garber
*Assistant Examiner* — Alia Sabur
(74) *Attorney, Agent, or Firm* — Greenblum & Bernstein, P.L.C.

(57) ABSTRACT

A method of fabricating a thin-film transistor substrate including a thin-film semiconductor includes: forming a metal film mainly comprising Cu above a substrate; forming a source electrode and a drain electrode by processing the metal film in a predetermined shape; irradiating the source electrode and the drain electrode with nitrogen plasma; exposing surfaces of a top and an end portion of the source electrode and the drain electrode with silane ($SiH_4$) gas; and forming an insulating layer comprising an oxide on the source electrode and the drain electrode.

14 Claims, 7 Drawing Sheets

(56) References Cited

U.S. PATENT DOCUMENTS

| | | | |
|---|---|---|---|
| 2004/0263724 A1* | 12/2004 | Kim | G02F 1/136213 |
| | | | 349/106 |
| 2006/0186549 A1 | 8/2006 | Usami et al. | |
| 2008/0054466 A1 | 3/2008 | Nasu et al. | |
| 2009/0134521 A1 | 5/2009 | Liu et al. | |
| 2009/0269923 A1* | 10/2009 | Lee | H01L 21/02074 |
| | | | 438/655 |
| 2010/0181673 A1 | 7/2010 | Hayashi et al. | |
| 2013/0093090 A1 | 4/2013 | Hayashi et al. | |
| 2015/0123118 A1* | 5/2015 | Yeom | H01L 29/45 |
| | | | 257/43 |

FOREIGN PATENT DOCUMENTS

| | | |
|---|---|---|
| JP | 2008-060414 | 3/2008 |
| JP | 2009-010016 | 1/2009 |
| JP | 2009-130369 | 6/2009 |
| JP | 2009-164471 | 7/2009 |
| JP | 2010-186977 | 8/2010 |

\* cited by examiner

METHOD OF FABRICATING THIN-FILM SEMICONDUCTOR SUBSTRATE

CROSS REFERENCE TO RELATED APPLICATION

The present application is based on and claims priority of Japanese Patent Application No. 2014-245393 filed on Dec. 3, 2014. The entire disclosure of the above-identified application, including the specification, drawings and claims is incorporated herein by reference in its entirety.

FIELD

The present disclosure relates to a method of fabricating a thin-film semiconductor substrate.

BACKGROUND

Thin-film transistors (TFTs) are used as switching elements or drive elements in active-matrix display devices, such as liquid-crystal display devices using liquid crystals or organic light-emitting diode (OLED) display devices using organic electro-luminescence (EL).

In recent years, regarding such display devices, there have been increased demands for pixel increase, area increase, and thickness reduction. Therefore, a TFT substrate having TFTs arranged in a matrix has technical aims of thinning each functional layer in the TFT substrate, reducing loss of electrodes and/or lines, and increasing a withstand voltage at an interlayer insulating film.

Patent Literature (PTL) 1 discloses a semiconductor device in which an alloy layer including a chemical element, which has an oxidation-reduction potential greater than that of copper, is disposed between a copper line and an insulating barrier film. This structure prevents oxidation of the copper line, thereby reducing an inter-line short circuit caused by copper oxides, withstand voltage reduction, and migration occurrence.

CITATION LIST

Patent Literature

[PTL 1] Japanese Unexamined Patent Application Publication No. 2009-164471

SUMMARY

Technical Problem

However, in the conventional semiconductor device described above, an alloy layer including a chemical element, such as silicon (Si), manganese (Mn), aluminum (Al), cobalt (Co), or nickel (Ni), which has an oxidation-reduction potential greater than that of copper, is disposed between a copper line and an insulating barrier film. This structure causes problems of fabricating process complication caused by forming of the alloy layer, increase in the number of fabricating processes, and increase in line resistance.

An object of the present disclosure is to provide a method of fabricating a thin-film semiconductor substrate for decreasing oxidation and resistance increase of electrodes and/or lines and reducing insulation failure by simplifying fabricating processes.

Solution to Problem

In order to achieve the above object, according to an aspect of the present disclosure, a method of fabricating a thin-film semiconductor substrate including a thin-film semiconductor includes: forming a semiconductor layer including the thin-film semiconductor above a substrate; forming a metal film mainly comprising Cu above the substrate; forming at least one of an electrode and a line by processing the metal film in a predetermined shape; irradiating the at least one of the electrode and the line with nitrogen plasma after the forming of the at least one of the electrode and the line; exposing surfaces of a top and an end portion of the at least one of the electrode and the line with silane ($SiH_4$) gas after the irradiating; and forming an insulating layer comprising an oxide on the at least one of the electrode and the line after the exposing.

Advantageous Effects

The present disclosure performs a surface modification treatment on the surfaces of the top and the end portion of electrodes and/or lines, by performing nitrogen plasma irradiation and silane exposure before forming an insulating layer. As a result, it is possible to decrease oxidation and resistance increase of the electrodes and/or lines and reduce insulation failure by simplified fabricating processes.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
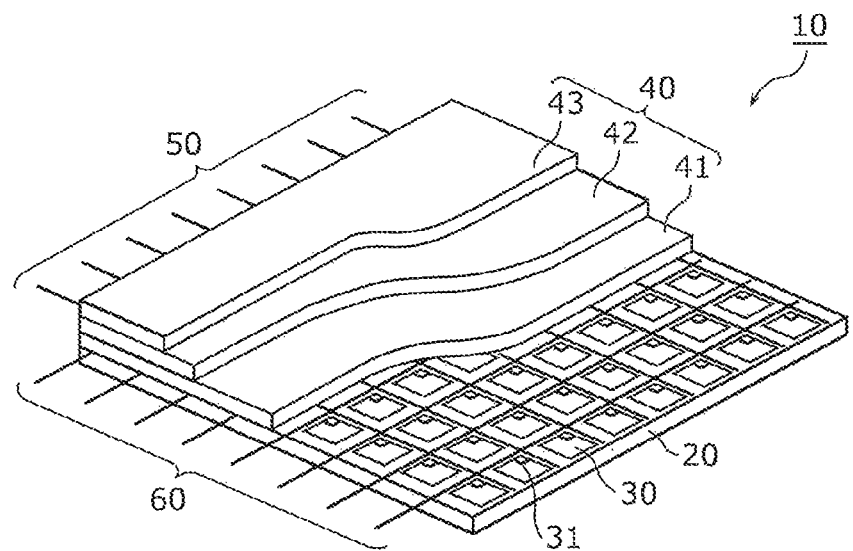
FIG. 1 is a partial cut-out perspective view of an organic EL display device according to an embodiment.

Underlying Knowledge Forming Basis of the Present Disclosure

Regarding the conventional semiconductor device described in "Background" section, the inventor of the present disclosure has found that the following problems occur.

When the conventional semiconductor device is applied to a TFT substrate for a large and high-definition display, a transparent amorphous oxide semiconductor (TAOS) is used as a channel layer in a TFT. In this case, from the viewpoint of preventing deterioration of the TAOS film, a silicon oxide film is used as an interlayer insulating layer on a source electrode and a drain electrode which include copper (Cu).

With this structure, the source electrode and the drain electrode are oxidized in forming of the silicon oxide film. Therefore, in the same manner as the structure disclosed in PTL 1, a cap layer (for example, a CuMn layer) for preventing the oxidation is formed on the top layers of the source electrode and the drain electrode which include Cu. However, in this structure, it is necessary to form the cap layer including a metal other than Cu. As a result, the number of fabricating processes is increased. Furthermore, for example, there are process problems, such as filter clogging in a development tank, which are characteristic problems occurred when using a metal, such as Mn. There is another problem that a stacked structure of the electrodes increases line resistance.

In order to address these problems, for example, in view of an affinity for a process of forming the silicon oxide film on the source electrode and the drain electrode, silicidation is performed on the top layers of the source electrode and the drain electrode to prevent oxidation of the source electrode and the drain electrode in forming of the silicon oxide film.

However, in the case where patterning is performed on a metal film to form electrodes, such as the source electrode and the drain electrode, and/or lines in the TFT substrate, the surface of the processed end portion of the electrodes and/or lines becomes rough and the silicidation is hardly obtained. In addition, as the substrate becomes larger in size, the silicidation is less homogeneous in the surface.

In order to address the conventional problems, according to an aspect of the present disclosure, a method of fabricating a thin-film semiconductor substrate including a thin-film semiconductor includes: forming a semiconductor layer including the thin-film semiconductor above a substrate; forming a metal film mainly comprising Cu above the substrate; forming at least one of an electrode and a line by processing the metal film in a predetermined shape; irradiating the at least one of the electrode and the line with nitrogen plasma after the forming of the at least one of the electrode and the line; exposing surfaces of a top and an end portion of the at least one of the electrode and the line with silane ($SiH_4$) gas after the irradiating; and forming an insulating layer comprising an oxide on the at least one of the electrode and the line after the exposing.

This method enables activation and silicidation of the surfaces of the top and the end portion of the electrodes and/or lines, by sequentially performing the nitrogen plasma irradiation and the silane exposure before forming the insulating layer. It is therefore possible to realize homogeneous silicidation by simplified fabricating processes. As a result, it is possible to decrease oxidation and resistance increase of electrodes and/or lines, and reduce insulation failure.

The following describes an embodiment according to the present disclosure with reference to the accompanying drawings. It should be noted that the subsequently-described embodiment shows a preferred example of the present disclosure. Therefore, numerical values, shapes, materials, structural components, the arrangement and connection of the structural components, processes (steps), the order of the processes, etc. indicated in the following embodiment are mere examples, and are not intended to limit the scope of the present disclosure. Among the structural components in the following embodiment, components not recited in the independent claim which indicates the broadest concept of the present disclosure are described as arbitrary structural components.

Furthermore, the respective figures are schematic diagrams and are not necessarily precise illustrations. In addition, in the respective diagrams, the same numerical sign is given to identical structural components, and repeated description of substantially identical components is omitted or simplified.

Moreover, in this Specification, the terms "above" and "below" do not refer to the upward (vertically upward) direction and downward (vertically downward) direction in terms of absolute spatial recognition, and are used as terms defined by relative positional relationships based on the stacking order of a stacked structure. Furthermore, the terms "above" and "below" are applied not only when two structural components are disposed with a gap therebetween or when a separate structural component is interposed between the two structural components, but also when two structural components are disposed in close contact with each other and come into contact with each other.

Embodiment

1. Organic EL Display Device

Figure 2:
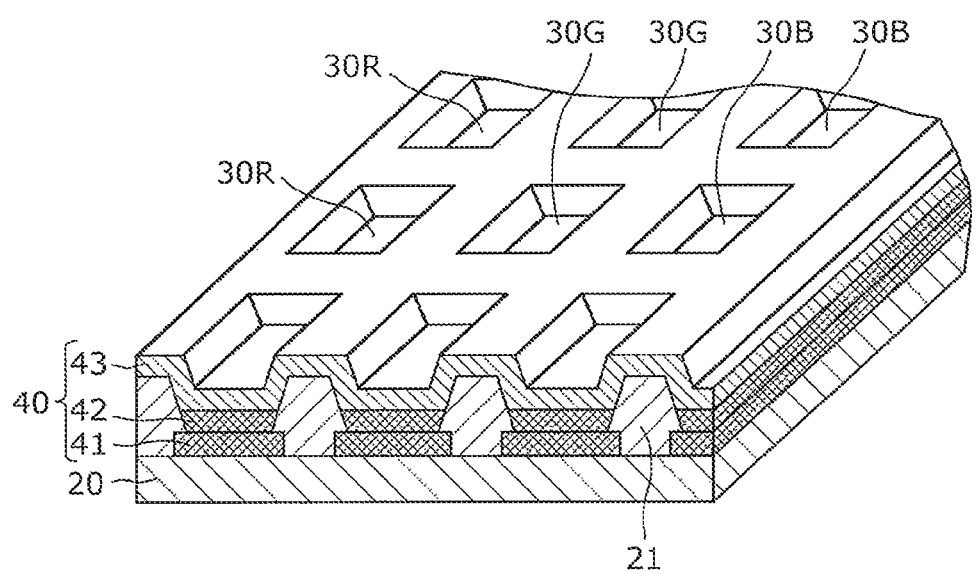
FIG. 2 is a perspective view of an example of pixel banks of the organic EL display device according to the embodiment.

First, the structure of an organic EL display device will be described as an example of a structure of a display device including a thin-film semiconductor substrate. FIG. 1 is a partial cut-out perspective view of the organic EL display device 10 according to this embodiment. FIG. 2 is a perspective view of an example of pixel banks of the organic EL display device 10 according to this embodiment.

1-1. Structure

As illustrated in FIG. 1, the organic EL display device 10 is configured of the stacked structure of: a thin-film semiconductor substrate (hereinafter, referred to also as "TFT substrate") 20 in which plural TFTs are disposed; and organic EL elements (light-emitting units) 40 each including an anode 41 which is a lower electrode, an EL layer 42 which is a light-emitting layer including an organic material, and a cathode 43 which is a transparent upper electrode.

Plural pixels 30 are arranged in a matrix in the TFT substrate 20, and pixel circuits 31 are provided in each of the pixels 30.

Each of the organic EL elements 40 is formed corresponding to a different one of the pixels 30, and control of the light emission of the organic EL element 40 is performed according to the pixel circuit 31 provided in the corresponding pixel 30. The organic EL elements 40 are formed on an interlayer insulating film (planarizing layer) formed to cover the TFTs.

Furthermore, the organic EL elements 40 have a structure in which the EL layer 42 is disposed between the anode 41 and the cathode 43. A hole transport layer is further formed stacked between the anode 41 and the EL layer 42, and an electron transport layer is formed stacked between the EL layer 42 and the cathode 43. It should be noted that another organic function layer may be provided between the anode 41 and the cathode 43.

Each of the pixels 30 is driven by the corresponding one of the pixel circuits 31. Furthermore, in the TFT substrate 20, plural gate lines (scanning lines) 50 are disposed along the row direction of the pixels 30, plural source lines (signal lines) are disposed along the column direction of the pixels 30 to cross with the gate lines 50, and plural power supply lines (not illustrated in FIG. 1) are disposed parallel to the source lines 60. The respective pixels 30 are partitioned by the crossing gate lines 50 and source lines 60, for example.

The gate lines 50 are connected, on a per-row basis, to gate electrodes of TFTs operating as switching elements included in the respective pixel circuits 31. The source lines 60 are connected, on a per-column basis, to source electrodes of TFTs operating as switching elements included in the respective pixel circuits 31. The power supply lines are connected, on a per-column basis, to drain electrodes of TFTs operating as driver elements included in the respective pixel circuits 31.

As illustrated in FIG. 2, each of the pixels 30 of the organic EL display device 10 is configured of subpixel 30R, 30G, or 30B of the three colors (red, green, and blue), and a plurality of these subpixels 30R, 30G, and 30B are formed in a matrix on the display face. The respective subpixels 30R, 30G, and 30B are separated from each other by banks 21.

The banks 21 are formed in a lattice pattern such that protrusions running parallel to the gate lines 50 and protrusions running parallel to the source lines 60 cross each other. In addition, the respective portions surrounded by these protrusions (in other words, the openings of the banks 21) correspond, on a one-to-one basis, to the respective subpixels 30R, 30G, and 30B. It should be noted that although a pixel bank structure is adopted for the banks 21 in this embodiment, a line bank structure may be adopted.

The anode 41 is formed for each of the subpixels 30R, 30G, and 30B, at a position that is on the interlayer insulating film (planarizing layer) on the TFT substrate 20 and inside the opening of the bank 21. In the same manner, the EL layer 42 is formed for each of the subpixels 30R, 30G, and 30B, at a position that is on the anode 41 and inside the opening formed by the bank 21. The transparent cathode 43 is formed continuously on the banks 21 to cover the entire EL layer 42 (i.e., all the subpixels 30R, 30G, and 30B).

In addition, the pixel circuits 31 are provided on a per-subpixel basis, and each of the subpixels 30R, 30G, and 30B are electrically connected to the corresponding pixel circuit 31 via a contact hole and a relay electrode. It should be noted that, aside from the difference in light-emission color of the EL layer 42, the subpixels 30R, 30G, and 30B have the same structure.

1-2. Pixel Circuit

Figure 3:
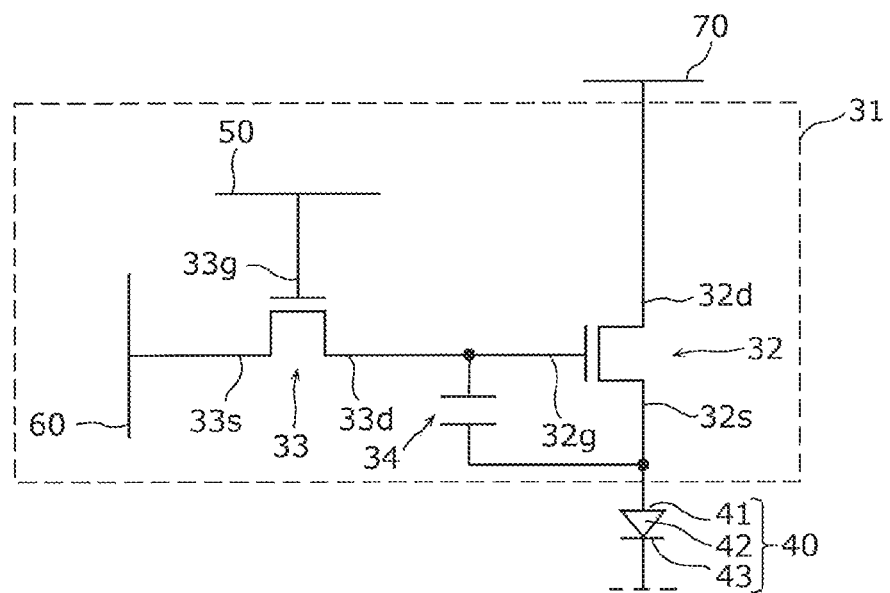
FIG. 3 is an electrical circuit diagram illustrating a structure of a pixel circuit in the organic EL display device according to the embodiment.

Here, the circuit structure of a pixel circuit 31 in a pixel 30 will be described using FIG. 3. FIG. 3 is an electrical circuit diagram illustrating the structure of a pixel circuit 31 in the organic EL display device 10 according to this embodiment.

As illustrated in FIG. 3, the pixel circuit 31 includes a TFT 32 that operates as a driver element, a TFT 33 that operates as a switching element, and a capacitor 34 that stores data to be displayed for the corresponding pixel 30. In this embodiment, the TFT 32 is a drive transistor for driving the organic EL element 40, and the TFT 33 is a switching transistor for selecting the pixel 30.

The TFT 32 includes: a gate electrode 32g connected to a drain electrode 33d of the TFT 33 and one end of the capacitor 34; a drain electrode 32d connected to the power supply line 70; a source electrode 32s connected to the other end of the capacitor 34 and the cathode 41 of the organic EL element 40; and a semiconductor film (not illustrated in the figure). The TFT 32 supplies current corresponding to the data voltage held by the capacitor 34, from the power supply line 70 to the anode 41 of the organic EL element 40 via the source electrode 32s. Accordingly, in the organic EL element 40, drive current flows from the anode 41 to the cathode 43, and the EL layer 42 thereby emits light.

The TFT 33 includes: a gate electrode 33g connected to the gate line 50; a source electrode 33s connected to the source line 60; a drain electrode 33d connected to one end of the capacitor 34 and the gate electrode 32g of the TFT 32; and a semiconductor film (not illustrated in the figure). When a predetermined voltage is applied to the gate line 50 and the source line 60 connected to the TFT 33, the voltage applied to the source line 60 is held as data voltage in the capacitor 34.

It should be noted that the organic EL display device 10 having the above-described structure uses the active-matrix system in which display control is performed for each pixel 30 located at the cross-point between a gate line 50 and a source line 60. Accordingly, the TFTs 32 and 33 of each pixel 30 (each of the subpixels 30R, 30G, and 30B) cause the corresponding organic EL element 40 to selectively emit light, and the desired image is displayed.

2. Structure of Thin-Film Semiconductor Substrate

Next, the structure of the thin-film transistor substrate (TFT substrate) 100 according to this embodiment will be described.

Figure 4:
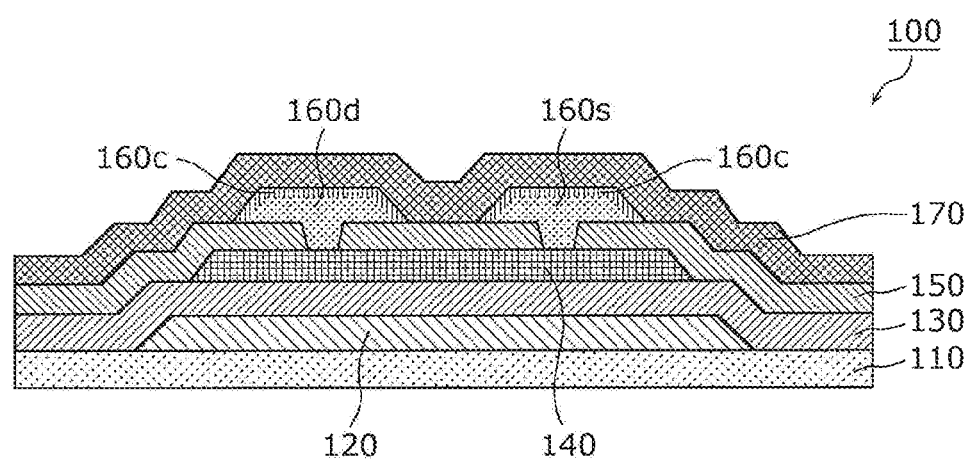
FIG. 4 is a cross-sectional view of a TFT substrate according to the embodiment.

FIG. 4 is a cross-sectional view of the TFT substrate 100 according to this embodiment.

The TFT substrate 100 is a thin-film semiconductor substrate that includes a substrate 110, a gate electrode 120, a gate insulating layer 130, an oxide semiconductor layer 140, an etching stopper (ES) layer 150, a source electrode 160s, a drain electrode 160d, and an insulating layer 170. The gate electrode 120, the gate insulating layer 130, the oxide semiconductor layer 140, the ES layer 150m, the source electrode 160s, and the drain electrode 160d are included in a TFT. As illustrated in FIG. 4, the TFT substrate 100 includes a channel protection bottom-gate TFT, and adopts a top-contact structure.

The following describes each of the structural components in the TFT substrate 100 according to this embodiment in detail.

The substrate 110 is an insulating substrate including an insulating material. An example of the substrate 110 is a glass substrate configured from a glass material, such as quartz glass, alkali-free glass, or high-heat resistance glass.

It should be noted that the substrate 110 is not limited to a glass substrate, and may be a resin substrate or the like including a resin material, such as polyethylene, polypropylene, or polyimide. The substrate 110 may be not only a rigid substrate but also a flexible substrate in the shape of a sheet or a film having a flexibility, such as a flexible glass substrate or a flexible resin substrate. For the flexible resin substrate, a substrate including a single layer or stacked layers of film material(s), such as polyimide, polyethylene terephthalate, and polyethylene naphthalate, can be used. It is also possible to form an undercoat layer on the surface of the substrate 110.

The gate electrode 120 is a metal layer that is formed in a predetermined shape above the substrate 110 and mainly includes Cu. More specifically, the gate electrode 120 has a single-layer structure or a multi-layer structure of conductive layer(s) including Cu, Cu alloy, and/or the like. For example, the gate electrode 120 has a stacked-layer structure of a first layer including molybdenum (Mo) and a second layer including Cu. The thickness of the gate electrode 120 is, for example, 20 nm to 500 nm. When the TFT substrate 100 is applied to a TFT substrate for a large and high-definition display, it is important to decrease resistance of electrodes and/or lines. From this point of view, Cu that is a low-resistance material is used as a material of the gate electrode 120.

It should be noted that the material of the gate electrode 120 may be aluminum, tantalum, molybdenum, tungsten, silver, copper, titanium, chromium, or the like. An example of the gate electrode 120 may be an electrode having a single-layer structure of a molybdenum tungsten film (MoW film).

The gate insulating layer 130 is disposed between the gate electrode 120 and the oxide semiconductor layer 140. In this embodiment, the gate insulating layer 130 is disposed above the gate electrode 120. For example, the gate insulating layer 130 is disposed over the whole substrate 110 provided with the gate electrode 120, covering the gate electrode 120. The thickness of the gate electrode layer 130 is, for example, 50 nm to 500 nm.

The gate insulating layer 130 is configured from an electrically insulating material. For example, the gate insulating layer 130 is a single-layer film, such as a silicon oxide film, a silicon nitride film, a silicon oxynitride film, an aluminum oxide film, a tantalum oxide film, or a hafnium oxide film, or a stacked film thereof.

Forming of a silicon oxide film produces less hydrogen in comparison to forming of a silicon nitride film. Therefore, the use of a silicon oxide film as the gate insulating layer 130 can reduce performance degradation of the oxide semiconductor layer 140 caused by hydrogen reduction.

The oxide semiconductor layer 140 is disposed above the substrate 110 to oppose the gate electrode 120. More specifically, the oxide semiconductor layer 140 is disposed at a position opposing the gate electrode 120 and on the gate insulating layer 130. For example, the oxide semiconductor layer 140 is formed in the shape of an island on the gate insulating layer 130 above the gate electrode 120. The thickness of the oxide semiconductor layer 140 is, for example, 30 nm to 150 nm.

The material of the oxide semiconductor layer 140 is, for example, an oxide semiconductor material including at least one of indium (In), gallium (Ga), and Zinc (Zn). For example, the oxide semiconductor layer 140 is configured from a transparent amorphous oxide semiconductor (TAOS), such as amorphous indium gallium zinc oxide (InGaZnO:IGZO).

The In:Ga:Zn ratio is, for example, approximately 1:1:1. Furthermore, although the In:Ga:Zn ratio may be in a range of (0.8 to 1.2):(0.8 to 1.2):(0.8 to 1.2), the ratio is not limited to this range.

The oxide semiconductor layer 140 is a channel layer in the TFT included in the TFT substrate 100. A TFT having a channel layer configured from a transparent amorphous oxide semiconductor has high carrier mobility, and is suitable for a display device having a large screen and high definition. Furthermore, since a transparent amorphous oxide semiconductor allows low-temperature film forming, a transparent amorphous oxide semiconductor can be easily formed above a flexible substrate, such as a plastic or film.

The ES layer 150 is disposed on the oxide semiconductor layer 140. More specifically, the ES layer 150 is formed above the gate insulating layer 130 to cover the oxide semiconductor layer 140. The thickness of the ES layer 150 is, for example, 50 nm to 500 nm.

In this embodiment, the ES layer 150 functions as a protection film (channel protection layer) for protecting a channel region in the oxide semiconductor layer 140. More specifically, when the source electrode 160s and the drain electrode 160d formed above the oxide semiconductor layer 140 are patterned by etching, the ES layer 150 functions as an etching stopper layer for preventing the oxide semiconductor layer 140 from being etched. This can reduce process damage at the backchannel side of the oxide semiconductor layer 140 in the bottom-gate TFT.

The ES layer 150 is configured from an electrically insulating material. For example, the ES layer 150 is a single-layer film, such as a silicon oxide film, a silicon nitride film, a silicon oxynitride film, or an aluminum oxide film, or a stacked film thereof.

As described previously, forming of a silicon oxide film produces less hydrogen in comparison to forming of a silicon nitride film. Therefore, the use of a silicon oxide film as the ES layer 150 can reduce performance degradation of the oxide semiconductor layer 140 caused by hydrogen reduction. Furthermore, if an aluminum oxide film is formed as the ES layer 150, the aluminum oxide film can block hydrogen and oxygen produced in a layer above the ES layer 150. Therefore, for the ES layer 150, a stacked-layer film having a three-layer structure of a silicon oxide film, an aluminum oxide film, a silicon oxide film, for example, may be used.

It should be noted that the material of the ES layer 150 is not limited to the inorganic material as above, but may be a material mainly including an organic material.

Furthermore, the ES layer 150 has openings (contact holes) each of which penetrates a part of the ES layer 150. The oxide semiconductor layer 140 is connected to the source electrode 160s and the drain electrode 160d through the openings in the ES layer 150.

Each of the source electrode 160s and the drain electrode 160d is an electrode mainly including Cu that is at least partially located above the ES layer 150 and has a predetermined shape allowing the electrode to be connected to the oxide semiconductor layer 140. More specifically, each of the source electrode 160s and the drain electrode 160d has a single-layer structure or a multi-layer structure of conductive layer(s) including Cu, Cu alloy, and/or the like. For example, each of the source electrode 160s and the drain electrode 160d has a stacked-layer structure of a first layer including Mo and a second layer including Cu. The thickness of each of the source electrode 160s and the drain electrode 160d is, for example, 100 nm to 500 nm. When the TFT substrate 100 is applied to a TFT substrate for a large and high-definition display, it is important to decrease resistance of electrodes and/or lines. From this point of view, Cu that is a low-resistance material is used as the material of the source electrode 160s and the drain electrode 160d.

Furthermore, the source electrode 160s and the drain electrode 160d are disposed to oppose each other with a distance therebetween and in a direction parallel to the substrate 110 (substrate parallel direction) on the ES layer 150. Moreover, each of the source electrode 160s and the drain electrode 160d is connected to the oxide semiconductor layer 140 through the opening in the ES layer 150.

The side surface at the end portion (hereinafter, referred to also as a "surface of the end portion") of each of the source electrode 160s, the drain electrode 160d, and the gate electrode 120 has a tapered shape inclined from a normal direction of the substrate 110 in a cross-sectional view.

Furthermore, a Cu silicide film 160c (not illustrated in FIG. 4) is provided to the upper surfaces including the surface of the end portion of each of the source electrode 160s and the drain electrode 160d. In other words, the Cu silicide film 160c is formed at the above-described position as a part of each of the source electrode 160s and the drain electrode 160d. The provision of the Cu silicide film 160c can reduce oxidation of the surfaces of the top and the end portion of each of the source electrode 160s and the drain electrode 160d in forming the insulating layer 170 (silicon oxide film) on the source electrode 160s and the drain electrode 160d. Here, "the surfaces of the top and the end portion" refer to the top surface and the side surface of the electrode/line.

It should be noted that the thickness of the Cu silicide film 160c is preferably in a range from 9 nm to 70 nm, inclusive. If the thickness of the Cu silicide film 160c is less than 9 nm, oxidation of the surfaces of the top and the end portion of each of the source electrode 160s and the drain electrode 160d progresses. As a result, color unevenness (cloudiness) occurs in the insulating layer 170 and homogeneous insulation properties cannot be obtained. On the other hand, if the thickness of the Cu silicide film 160c is greater than 70 nm, electrode resistance increases in accordance with the thickness increase of the Cu silicide film 160c.

If an insulating layer is formed on the electrode 160s and the drain electrode 160d in the state where the Cu silicide film 160c is not provided to the surfaces of the top and the end portion of each of the source electrode 160s and the drain electrode 160d, pretreatment for forming the insulating layer, such as reduction treatment using nitrogen gas plasma irradiation by chemical vapor deposition (CVD), causes roughness of the surfaces of the top and the end portion. This reduces adhesion between the insulating layer and each of the source electrode 160s and the drain electrode 160d, causes thermal migration, makes the insulating layer inhomegeneous, and eventually causes insulation failure of the TFT.

In contrast, in the TFT substrate 100 according to this embodiment, the provision of the Cu silicide film 160c to the surfaces of the top and the end portion of each of the source electrode 160s and the drain electrode 160d protects the surfaces of the top and the end portion from plasma of nitrogen gas and the like in forming of the insulating layer 170. Therefore, thermal migration occurred from the surfaces of the top and the end portion can be reduced. As a result, it is possible to decrease a short circuit through the insulating layer 170 and thus reduce insulation failure of the TFT.

The insulating layer 170 is an insulating layer disposed on the source electrode 160s and the drain electrode 160d. More specifically, the insulating layer 170 is disposed on and above the ES layer 150, covering the source electrode 160s and the drain electrode 160d. The thickness of the insulating layer 170 is, for example, 50 nm to 500 nm.

The insulating layer 170 includes an electrically insulating material. For example, the insulating layer 170 is a single-layer film, such as a silicon oxide film, a silicon nitride film, a silicon oxynitride film, or an aluminum oxide film, or a stacked film thereof.

Forming of a silicon oxide film produces less hydrogen in comparison to forming of a silicon nitride film. Therefore, the use of a silicon oxide film as the insulating layer 170 can reduce performance degradation of the oxide semiconductor layer 140 caused by hydrogen reduction. Furthermore, if an aluminum oxide film is used as the insulating layer 170, an aluminum oxide film can block hydrogen or oxygen produced in a layer above the insulating layer 170. Therefore, for the insulating layer 170, a stacked-layer film having a three-layer structure of a silicon oxide film, an aluminum oxide film, a silicon oxide film, for example, may be used.

In the same manner as the source electrode 160s and the drain electrode 160d, it is also possible to provide the Cu silicide film described previously to the surfaces of the top and the end portion of the gate electrode 120. The provision of the Cu silicide film protects the surfaces of the top and the end portion of the gate electrode 120 from plasma of nitrogen gas and the like in forming of the gate insulating layer 130. As a result, thermal migration caused from the surfaces of the top and the end portion can be reduced.

3. Method of Fabricating Thin-Film Semiconductor Substrate

Figure 5A:
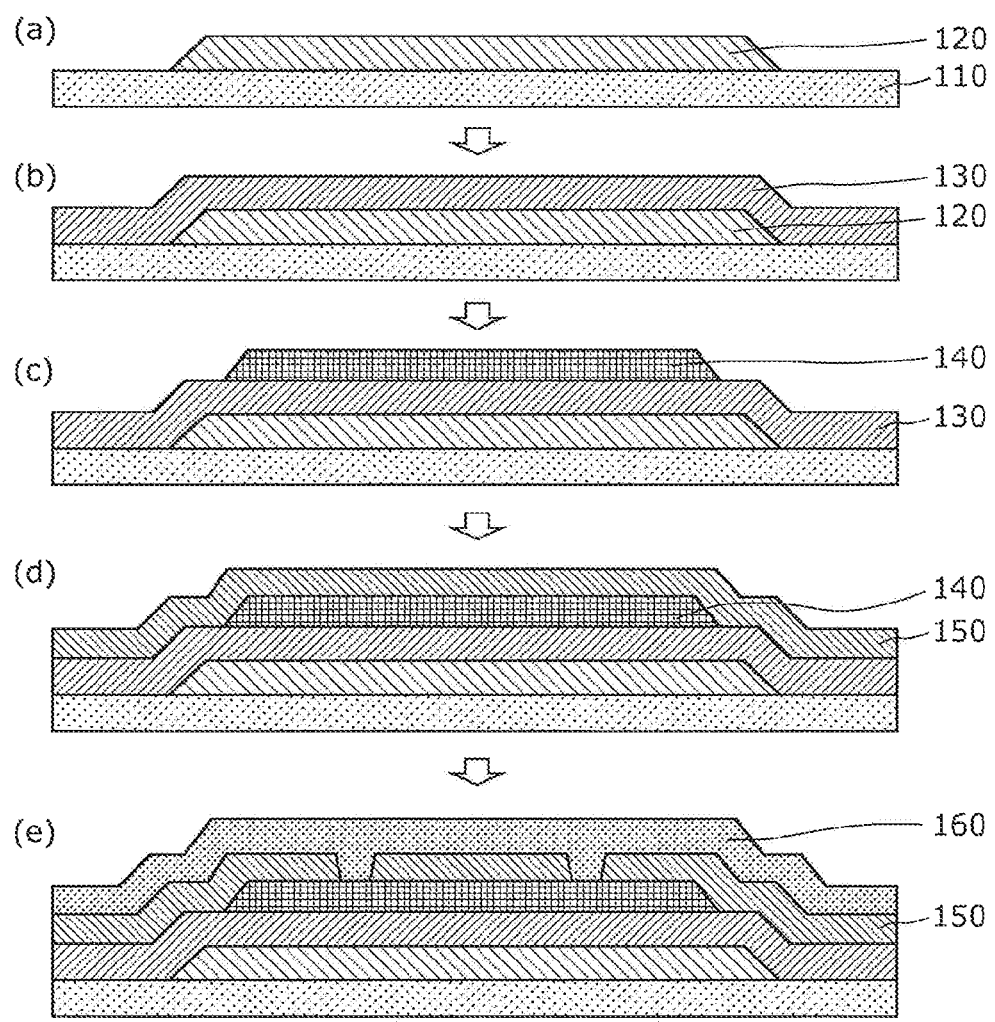
FIG. 5A illustrates outline cross-sectional views of processes of fabricating the TFT substrate according to the embodiment.
Figure 5B:
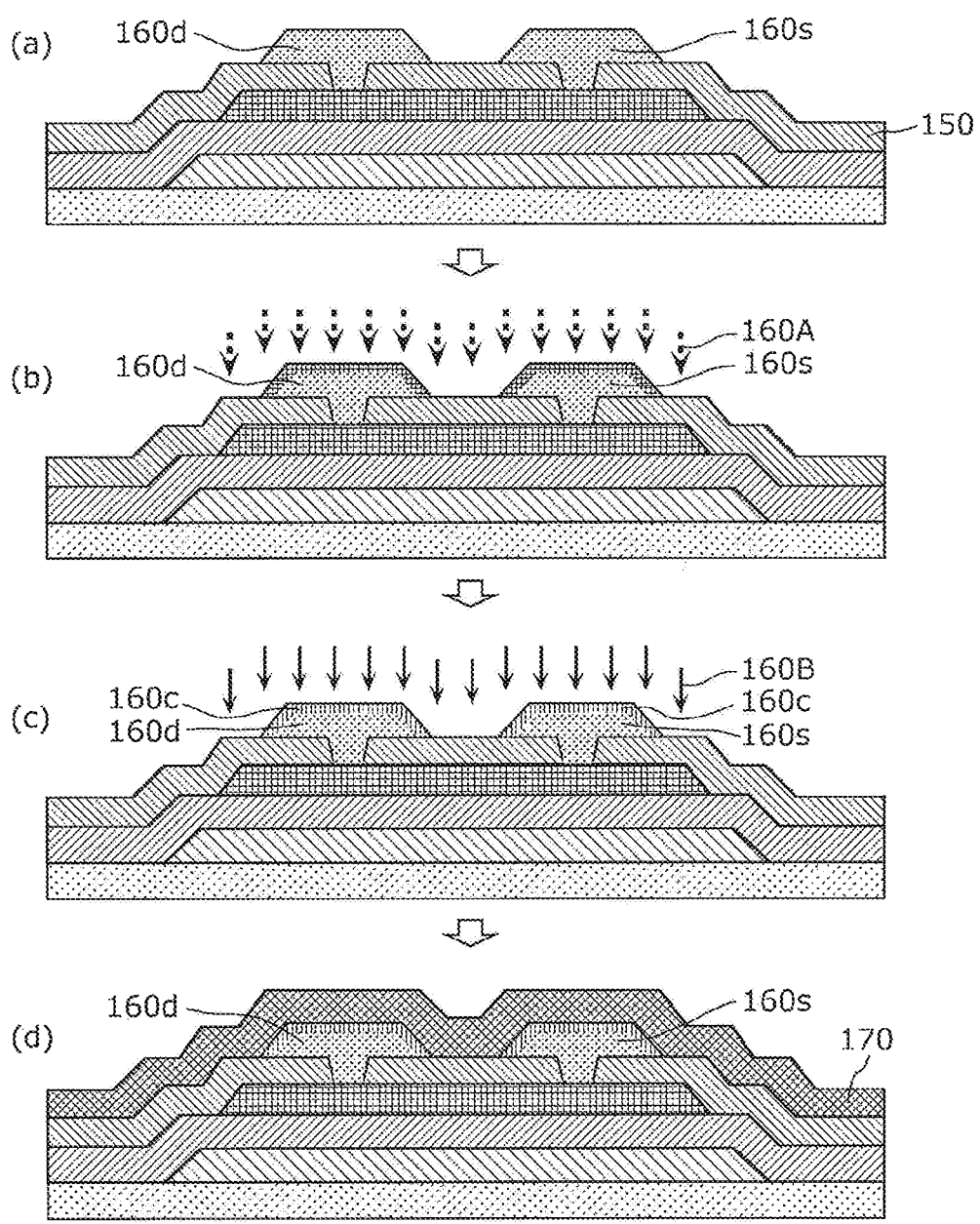
FIG. 5B illustrates outline cross-sectional views of processes of fabricating the TFT substrate according to the embodiment.

Next, the method of fabricating the TFT substrate 100 according to this embodiment will be described with reference to FIG. 5A and FIG. 5B. FIG. 5A and FIG. 5B are outline cross-sectional views illustrating processes of fabricating the TFT substrate according to this embodiment.

3-1. Gate Electrode Forming Process

First, as illustrated in (a) in FIG. 5A, the substrate 110 is prepared, and a metal film mainly including Cu is formed above the substrate 110. Next, the metal film is processed in a predetermined shape, thereby forming the gate electrode 120. For example, the metal film is formed above the substrate 110 by sputtering, and the formed metal film is processed by photolithography and etching to form the date electrode 120 of the predetermined shape.

More specifically, for example, a glass substrate is prepared as the substrate 110, and the first layer having a thickness of 20 nm and including Mo and the second layer having a thickness of 200 nm and including Cu are sequentially formed above the substrate 110 by sputtering.

Then, a resist pattern is formed by photolithography, and the first layer and the second layer are processed by wet etching at room temperature using a phosphoric-acetic-nitric-acid (PAN) solution, thereby forming the gate electrode 120. Furthermore, a stripping solution containing an alkaline additive may be used in the stripping of the resist. It should be noted that the method of processing the first layer and the second layer is not limited to the wet etching, but may be dry etching using various kinds of reactive gases or inert gases.

This gate electrode forming process allows the side surface at the end portion of the gate electrode 120 to have a tapered shape inclined from a normal direction of the substrate 110 in a cross-sectional view. It should be noted that a taper angle of the tapered portion at the end portion of the gate electrode 120 is preferably small (in other words, an angle between the normal of the substrate 110 and the inclined plane of the tapered portion is large). This is because, as the taper angle at the end portion of the gate electrode 120 is larger, the covering state of the gate insulating layer 130 to be formed on the tapered portion to cover the gate electrode 120 is less sufficient, and a risk of a short circuit between the gate electrode 120 and the source electrode 160s or the drain electrode 160d increases.

Furthermore, the substrate 110 is, for example, a glass substrate having a size of G8.5 (thickness: 0.5 mm, X: 2500 mm×Y: 2200 mm). It is also possible that, before forming the gate electrode 120, an undercoat layer, such as a silicon oxide film, is formed on the surface of the substrate 110.

3-2. Gate Insulating Layer Forming Process

Next, as illustrated in (b) in FIG. 5A, the gate insulating layer 130 is formed on the gate electrode 120. In this embodiment, the gate insulating layer 130 is formed over the whole substrate 110 to cover the gate electrode 120.

An example of the gate insulating layer 130 is a silicon oxide film. In this case, the silicon oxide film is formed by plasma CVD using silane gas ($SiH_4$) and nitrous oxide gas ($N_2O$) as introduced gases.

3-3. Semiconductor Layer Forming Process

Next, as illustrated in (c) in FIG. 5A, the oxide semiconductor layer 140 of a predetermined shape is formed at a position that is above the substrate 110 and opposes the gate electrode 120 with respect to a direction perpendicular to the substrate 110 (semiconductor layer forming process). For example, an oxide semiconductor film is formed on the gate insulating layer 130 by sputtering. Then, the oxide semiconductor film is processed by photolithography and etching to form the oxide semiconductor layer 140 of the predetermined shape. The oxide semiconductor layer 140 is a semiconductor layer serving as a channel layer in the TFT.

Specifically, an amorphous InGaZnO film having a thickness of 90 nm is formed on the gate insulating layer 130 by sputtering under an oxygen ($O_2$) and argon (Ar) mixed gas atmosphere, using a target material having an In:Ga:Zn composition ratio=1:1:1. More specific film-forming conditions are, for example, in DC magnetron sputtering:power is 12 kW; film-forming gas oxygen partial pressure is 4.5%; and a film-forming rate is 100 nm/min.

Then, the amorphous InGaZnO film formed on the gate insulating layer 130 is wet-etched to form the oxide semiconductor layer 140. The wet etching of InGaZnO can be performed using, for example, a chemical solution obtained by mixing phosphoric acid ($H_3PO_4$), nitric acid ($HNO_3$), and a surface-active agent. Furthermore, a stripping solution containing an alkaline additive may be used in the stripping of the resist.

3-4. ES Layer Forming Process

Next, as illustrated in (d) in FIG. 5A, the ES layer 150 is formed on the oxide semiconductor layer 140. In this embodiment, the ES layer 150 is formed over the whole gate insulating layer 130 to cover the oxide semiconductor layer 140.

An example of the ES layer 150 is a silicon oxide film. In this case, the silicon oxide film is formed by plasma CVD using silane gas ($SiH_4$) and nitrous oxide gas ($N_2O$) as introduced gases.

Next, as illustrated in (e) in FIG. 5A, contact holes are formed in the ES layer 150 to expose portions of the region of the oxide semiconductor layer 140. Specifically, portions of the ES layer 150 are removed (etched) by photolithography and etching to form contact holes (openings) above the regions to be a source contact region and a drain contact region.

For example, if the ES layer 150 is a silicon oxide film, contact holes can be formed in the silicon oxide film by dry etching using reactive ion etching (RIE). In this case, for example, carbon tetrafluoride ($CF_4$) and oxygen gas ($O_2$) can be used as etching gases.

3-5. Metal Film Forming Process

Subsequently, as illustrated in (e) in FIG. 5A, the metal film 160 mainly including Cu is formed on the ES layer 150 (metal film forming process). Specifically, first, a first layer having a thickness of 20 nm and including Mo and a second layer having a thickness of 200 nm and including Cu are sequentially formed on the ES layer 150 by sputtering so as to fill the contact holes formed in the ES layer 150.

3-6. Electrode/Line Forming Process

Next, as illustrated in (a) in FIG. 5B, the metal film 160 is processed in a predetermined shape to form the source electrode 160s and the drain electrode 160d (electrode/line forming process). For example, the metal film 160 is processed by photolithography and etching to form the source electrode 160s and the drain electrode 160d to have the predetermined shape. More specifically, a resist pattern is formed by photolithography, and the first layer and the second layer are processed by wet etching at room temperature using a PAN solution, so as to form the source electrode 160s and the drain electrode 160d. Furthermore, a stripping solution containing an alkaline additive may be used in the stripping of the resist. It should be noted that the method of processing the first layer and the second layer is not limited to the wet etching, but may be dry etching using various kinds of reactive gases or inert gases.

This process of forming the source electrode 160s and the drain electrode 160d allows the side surface at the end portion of each of the source electrode 160s and the drain electrode 160d to have a tapered shape inclined from a normal direction of the substrate 110 in a cross-sectional view.

3-7. Nitrogen Plasma Irradiation Process

Next, as illustrated in (b) in FIG. 5B, the source electrode 160s and the drain electrode 160d are irradiated with nitrogen plasma 160A produced from $N_2$ gas (nitrogen plasma irradiation process). The irradiation conditions of the nitrogen plasma 160A are, for example, for a G8.5 substrate: a pressure is 100 Pa to 200 Pa; an $N_2$ flow rate is 15000 sccm to 20000 sccm; RF power is 3 kW/13 MHz; a treatment temperature is 200° C. to 250° C.; and an irradiation time is 30 seconds. Thereby, prior to the silane exposure process performed as a subsequent process for facilitating silicidation on the surfaces of the top and the end portion of each of the source electrode 160s and the drain electrode 160d, the nitrogen plasma irradiation process can cause the surfaces of the top and the end portion to be in an activated state.

3-8. Silane Exposure Process

Next, as illustrated in (c) in FIG. 5B, $SiH_4$ gas 160B is exposed to the source electrode 160s and the drain electrode 160d (silane exposure process). The conditions of the $SiH_4$ gas 160B exposure are, for example, for a G8.5 substrate: a pressure is 100 Pa to 200 Pa; a $SiH_4$ flow rate is 800 sccm to 1200 sccm; a treatment temperature is 200° C. to 250° C.; and an exposure time is 300 seconds. Thereby, the Cu silicide film 160c is formed at the surfaces of the top and the end portion of each of the source electrode 160s and the drain electrode 160d. This process protects the surfaces of the top and the end portion of each of the source electrode 160s and the drain electrode 160d from plasma of nitrogen gas and the like used in the subsequent insulating layer forming process of forming the insulating layer 170. As a result, it is possible to reduce thermal migration caused from the surfaces of the top and the end portion. Eventually, a short circuit through the insulating layer 170 can be decreased, and insulation failure of the TFT can be reduced.

Although in this silane exposure process, the SiH$_4$ gas 160B is exposed to the surfaces of the top and the end portion of each of the source electrode 160s and the drain electrode 160d without producing RF plasma, it is also possible to use RF plasma obtained by diluting SiH$_4$ gas by N$_2$ gas.

3-9. Insulating Layer Forming Process

Finally, as illustrated in (d) in FIG. 5B, the insulating layer 170 including oxide is formed on the source electrode 160s and the drain electrode 160d (insulating layer forming process). In this embodiment, the insulating layer 170 is formed over the whole surface of the ES layer 150 to cover the source electrode 160s and the drain electrode 160d.

An example of the insulating layer 170 is a silicon oxide film. In this case, the silicon oxide film is formed by plasma CVD using silane gas (SiH$_4$) and nitrous oxide gas (N$_2$O) as introduced gases.

As described above, the TFT substrate 100 having the structure illustrated in FIG. 4 can be fabricated.

It should be noted that irradiation of nitrogen plasma produced from N$_2$ gas onto the source electrode 160s and the drain electrode 160d (post nitrogen plasma irradiation process) may be performed between the silane exposure process and the insulating layer forming process. The conditions of the nitrogen plasma irradiation in the post nitrogen plasma irradiation process may be based on the conditions of the nitrogen plasma irradiation in the nitrogen plasma irradiation process described previously. The addition of the post nitrogen plasma irradiation process can fix the Cu silicide film 160c formed in the silane exposure process to the surfaces of the top and the end portion of each of the source electrode 160s and the drain electrode 160d. As a result, it is possible to cause the Cu silicide film 160c to be stable even in the subsequent insulating layer forming process of forming the insulating layer 170.

It should be noted that it is preferable that the above-described nitrogen plasma irradiation process, silane exposure process, and insulating layer forming process are sequentially performed. More specifically, after performing the nitrogen plasma irradiation and the silane exposure using a plasma CVD device, the forming of the insulating layer 170 is performed without breaking a vacuum in a chamber of the plasma CVD device. Thereby, it is possible to decrease a risk of mixing impurities.

4. Suitable Conditions of the Nitrogen Plasma Irradiation Process and the Silane Exposure Process Here, the treatment conditions of the nitrogen plasma irradiation process and the silane exposure process will be described.

Figure 6:
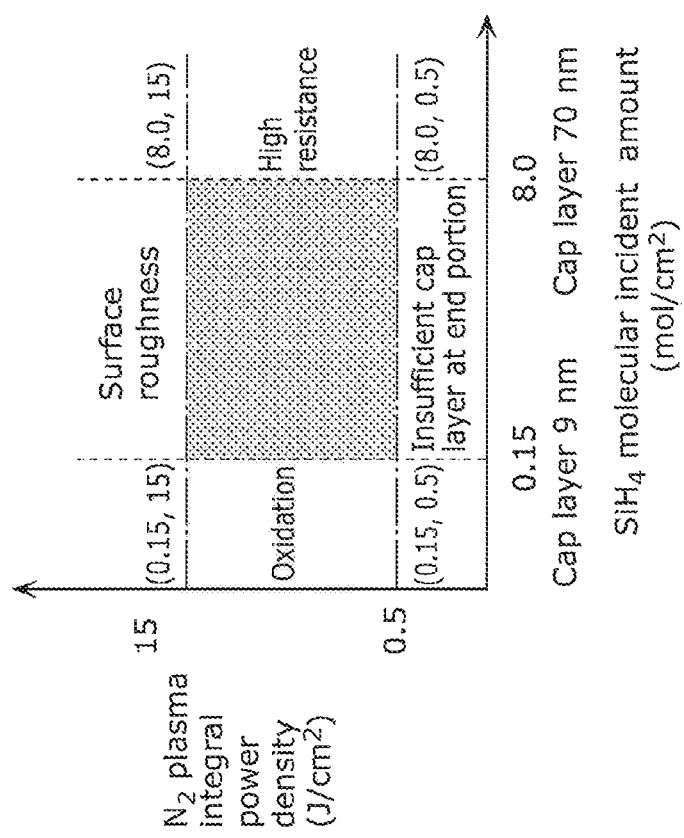
FIG. 6 is a graph for explaining process conditions suitable for a nitrogen plasma irradiation process and a silane exposure process according to the embodiment.

FIG. 6 is a graph for explaining treatment conditions suitable for the nitrogen plasma irradiation process and the silane exposure process according to this embodiment. In the graph of this figure, a vertical axis indicates an integral power density of the nitrogen plasma 160A irradiated on the source electrode 160s and the drain electrode 160d in the nitrogen plasma irradiation process. A horizontal axis in the graph indicates a molecular incident amount of the SiH$_4$ gas 160B incident on the source electrode 160s and the drain electrode 160d in the silane exposure process.

As seen in the graph in this figure, the N$_2$ plasma integral power density in the nitrogen plasma irradiation process is preferably in a range from 0.5 J/cm$^2$ to 15 J/cm$^2$, inclusive.

Furthermore, the SiH$_4$ molecular incident amount in the silane exposure process is preferably in a range from 0.15 mol/cm$^2$ to 8.0 mol/cm$^2$, inclusive.

If electrodes and/or lines in a TFT are pattern-processed by lithography, surface of a processed end portion becomes rough and silicidation is hardly obtained. In addition, as a TFT substrate becomes larger in size, the silicidation is less homogeneous in the surface. In contrast, in this embodiment, after patterning the electrodes and/or lines in the TFT, the nitrogen plasma irradiation process is performed at the above-described N$_2$ plasma integral power density and the silane exposure process is performed with the above-described SiH$_4$ molecular incident amount. As a result, it is possible to form a Cu silicide layer (cap layer) that is homogeneous in surface including the processed end portion described above.

In the silicidation on the surfaces of the top and the end portion of each of the source electrode 160s and the drain electrode 160d in the silane exposure process, if the SiH$_4$ molecular incident amount is smaller than 0.15 mol/cm$^2$, the silicon oxide film formed in the subsequent insulating layer forming process facilitates oxidation of Cu in the source electrode 160s and the drain electrode 160d. As a result, color unevenness, such as cloudiness, occurs at the interface between the insulating layer 170 and each of the source electrode 160s and the drain electrode 160d. On the other hand, if the SiH$_4$ molecular incident amount is larger than 8.0 mol/cm$^2$, the thickness of the Cu silicide film 160c is increased, thereby increasing electrode resistance.

The irradiation of the nitrogen plasma 160A in the nitrogen plasma irradiation process is treatment for activating the end portion of each of the source electrode 160s and the drain electrode 160d by N atom supply so as to obtain sufficient silicidation of the end portion in the subsequent silane exposure process. If the N$_2$ plasma integral power density is lower than 0.5 J/cm$^2$, protrusions occur at the end portion of each of the source electrode 160s and the drain electrode 160d due to thermal migration. On the other hand, if the N$_2$ plasma integral power density is higher than 15 J/cm$^2$, the reduction action caused by the nitrogen plasma 160A increases roughness of the surfaces of the top and the end portion of each of the source electrode 160s and the drain electrode 160d. As a result, adhesion with the insulating layer 170 is decreased and thermal migration occurs.

Here, the conditions of a boundary defining a suitable range of the SiH$_4$ molecular incident amount in the silane exposure process will be described.

4-1. Lower Limit of Molecular Incident Amount in Silane Exposure Process

First, a lower limit of the SiH$_4$ molecular incident amount S is calculated.

The SiH$_4$ molecular incident amount S is defined by the following equation 1.

SiH$_4$ molecular incident amount S=molecular incident frequency Γ×treatment period $t1$ (Equation 1)

In the equation 1, the molecular incident frequency Γ is the number of molecules incident per second for each unit area, and can be expressed by the following equation 2.

[Math. 1]

$$\Gamma = \frac{p}{\sqrt{2\pi mkT}} \quad \text{(Equation 2)}$$

In the equation 2, p is a pressure, m is a mass per one $SiH_4$ molecule, k is Boltzmann's constant, and T is a temperature. If p=133.3 (Pa), m=0.018/Avogadro's constant (kg), T=503 K (230° C.) are substituted to the variants p, m, and T, respectively, $\Gamma=3.69\times10^{24}$ (1/m$^2$) is obtained.

Figure 7:
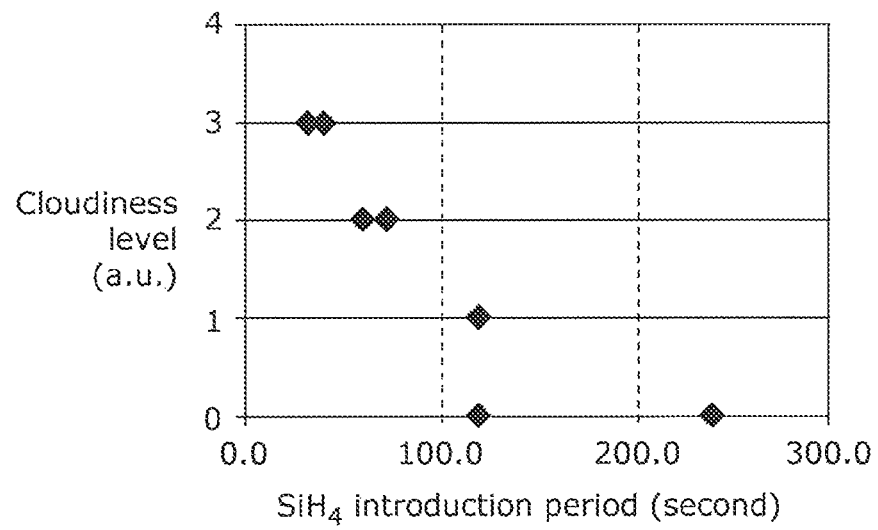
FIG. 7 is a graph plotting a relationship between a silane gas introduction period and a cloudiness level at an interface between an electrode and an insulating layer.

Furthermore, a lower limit of the treatment period t1 in the equation 1 can be determined based on measured data shown in FIG. 7.

FIG. 7 is a graph plotting a relationship between a silane gas introduction period and a cloudiness level at the interface between the electrode and the insulating layer. In the graph in FIG. 7, a horizontal axis indicates an introduction period in which $SiH_4$ gas is introduced to the source electrode 160s and the drain electrode 160d, and a vertical axis indicates a cloudiness level at the interface between the insulating layer 170 and each of the source electrode 160s and the drain electrode 160d. As the cloudiness level has a value closer to 0, the interface has less color unevenness and is more transparent. As the cloudiness level has a greater value, the cloudiness progresses. Furthermore, the treatment conditions for obtaining the properties in the graph are: P=133.3 (Pa); and T=503 K (230° C.).

As seen in FIG. 7, as the $SiH_4$ gas introduction period is longer, the cloudiness level is improved at the interface, and the cloudiness completely disappears in the treatment period t1=250 seconds. Based on the above result, the lower limit of the treatment period t1 in the equation 1 is set to 250 seconds.

If $\Gamma=3.69\times10^{24}$ (1/m$^2$) calculated in the equation 2 and the treatment period t1=250 seconds determined based on the measured data in FIG. 7 are substituted in the equation 1, the lower limit $S_{min}$ of the $SiH_4$ molecular incident amount S is 0.153 mol/cm$^2$.

Furthermore, the thickness L of the Cu silicide film 160c is expressed by the following equation 3.

[Math. 2]

$$L = 2\sqrt{D \cdot t} \quad \text{(Equation 3)}$$

Here, D is a Si impurity diffusion coefficient in Cu, and expressed by the following equation 4.

[Math. 3]

$$D = D_0 \exp\left(\frac{-Q}{RT}\right) \quad \text{(Equation 4)}$$

Here, $D_0$ and Q are diffusion parameters obtained in the case where not more than 1% of $SiH_4$ is included in Cu. More specifically, $D_0=5\times10^8$ (m$^2$/mol), and Q=113 (kJ/mol).

According to the equation 3, the equation 4, T=503 K, and t1=250 seconds, a minimum thickness $L_{min}$ of the Cu silicide film 160c is calculated as 9.6 nm.

4-2. Upper Limit of Molecular Incident Amount in Silane Exposure Process

Next, an upper limit of the $SiH_4$ molecular incident amount S is derived.

As the thickness of the Cu silicide film 160c increases, electrode resistance increases. Based on this, an upper limit $S_{max}$ of the $SiH_4$ molecular incident amount is assumed to be a value obtained in the case where a resistance value of the source electrode 160s and the drain electrode 160d each of which includes the Cu silicide film 160c is equal to a resistance value of an Al electrode having a thickness of 300 nm.

First, a measured value of sheet resistance of a Cu electrode having a thickness of 300 nm is 0.074Ω/□. Therefore, a specific resistance Rc of Cu is 2.2.2 μΩ·cm. On the other hand, a sheet resistance Ra of the Al electrode having a thickness of 300 nm is 0.093Ω/□, because a specific resistance of Al is 2.8 μΩ·cm. Here, assuming that the surface of a Cu electrode is cilisidated (Cu3Si: specific resistance Rs=16.3 μΩ·cm) to have a thickness $L_{max}$ (nm), the conditions of the situation where a combined resistance of the Cu electrode including the silicide film 160c is equal to a sheet resistance Ra of the Al electrode having a thickness of 300 nm are expressed by the following equation 5.

[Math. 4]

$$Ra = \frac{\frac{Rc}{(300 - L_{max})} \cdot \frac{Rs}{L_{max}}}{\frac{Rc}{(300 - L_{max})} + \frac{Rs}{L_{max}}} \quad \text{(Equation 5)}$$

If the specific resistances Ra, Rc, and Rs are substituted to the equation 5, a maximum thickness $L_{max}$ of the Cu silicide film 160c is calculated as 70 nm. By substituting the maximum thickness $L_{max}$ of the silicide film 160c to the equation 3, the upper limit of the treatment period t1=13377 seconds is obtained. If the upper limit of the treatment period t1 and $\Gamma=3.69\times10^{24}$ (1/m$^2$) are substituted to the equation 1, the upper limit $S_{max}$ of the $SiH_4$ molecular incident amount is calculated as 8.0 mol/cm$^2$.

4-3. Lower Limit and Upper Limit of Integral Power Density in Nitrogen Plasma Irradiation Process Next, conditions of a boundary defining a suitable range of the $N_2$ plasma integral power density N in the nitrogen plasma irradiation process is described.

The $N_2$ plasma integral power density N is defined by the following equation 6.

$$N_2 \text{ plasma integral power density } N = \text{plasma power density } E \times \text{plasma irradiation period } t2 \quad \text{(Equation 6)}$$

In the equation 6, the $N_2$ plasma integral power density N is an integral value of plasma power per unit area.

Here, a lower limit and an upper limit of the plasma irradiation period t2 in the equation 6 are determined based on the measured data shown in FIG. 7.

Figure 8:
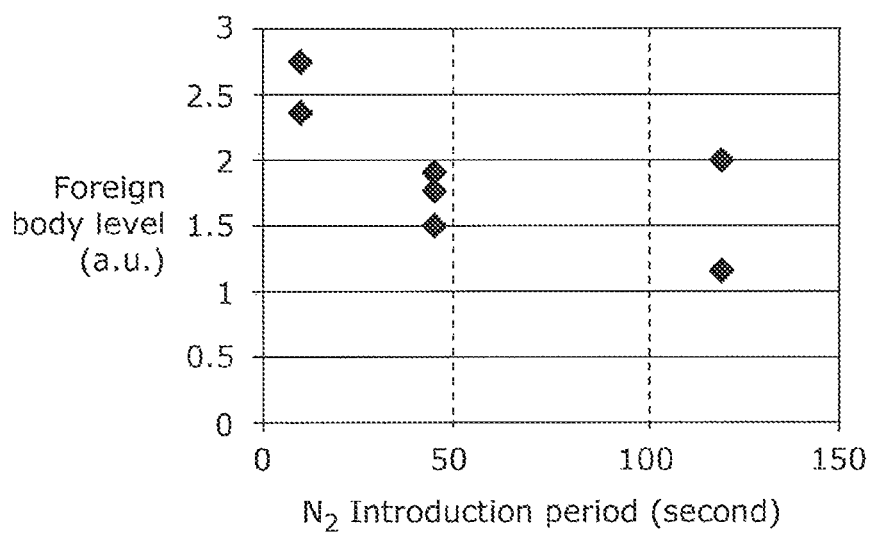
FIG. 8 is a graph plotting a relationship between a nitrogen gas introduction period and a foreign body level at surfaces of a top and an end portion of the electrode.

FIG. 8 is a graph plotting a relationship between a nitrogen gas introduction period and a foreign body level at the surfaces of the top and the end portion of the electrode. In the graph in FIG. 8, a horizontal axis indicates a period in which $N_2$ gas is introduced in the source electrode 160s and the drain electrode 160d, and a vertical axis indicates an occurrence level of protrusions (foreign bodies) caused by migration at the end portion of each of the source electrode 160s and the drain electrode 160d. As the foreign body level has a value closer to 0, the occurrence of foreign bodies is decreased. As the foreign body level has a greater value, the foreign bodies increase in number and in size.

As seen in the graph in FIG. 8, as the $N_2$ gas introduction period is longer, the foreign body level is improved at the above-descried interface. However, not being illustrated, the foreign body level is likely to be saturated, if the $N_2$ gas introduction period is 300 seconds or longer. Therefore, the upper limit of the plasma irradiation period t2 is determined as 300 seconds.

Furthermore, if irradiation of $NH_3$ plasma, which has a reduction power stronger than that of $N_2$ gas, is performed for 30 seconds, the protrusions caused by migration disappear, but the surface becomes rough to decrease a yield of the TFT. In consideration of the experimental results and the properties that $N_2$ gas exposure has a reduction power weaker than that of $NH_3$ plasma, the lower limit of the plasma irradiation period t2 is determined as 10 seconds.

On the other hand, since the plasma power density E in the equation 6 is a division of power provided to the TFT substrate 100 by an area of the TFT substrate, the plasma power density E is calculated as, for example, E=3000 (W)/55000 $(cm^2)$=5.4×$10^{-2}$ (W/$cm^2$).

Thus, the upper limit $N_{max}$ and the lower limit $N_{min}$ of the $N_2$ plasma integral power density are calculated as 15 J/$cm^2$ and 0.5 J/$cm^2$, respectively, by substituting the upper limit of 300 seconds and the lower limit of 10 seconds of the plasma irradiation period t2 and plasma power density E=5.4×$10^{-2}$ W/$cm^2$ to the equation 6.

If the $N_2$ plasma integral power density is set to approximately the lower limit $N_{min}$ in the nitrogen plasma irradiation process and the $SiH_4$ molecular incident amount is set to approximately the upper limit $S_{max}$ in the silane exposure process, the excessive silane gas increases influence of N atom desorption from the surface of each of the source electrode 160s and the drain electrode 160d. It is therefore considered that a requirement of the $N_2$ plasma integral power density N increases at approximately upper limit $S_{max}$ of the $SiH_4$ molecular incident amount. Therefore, if the $SiH_4$ molecular incident amount S is set to 8.0 mol/$cm^2$, the lower limit $N_{min}$ of the $N_2$ plasma integral power density may be set to 1.0 J/$cm^2$. In other words, it is possible to change the lower limit $N_{min}$ of the $N_2$ plasma integral power density from 0.5 J/$cm^2$ towards 1.0 J/$cm^2$, by increasing the $SiH_4$ molecular incident amount S from lower limit $S_{min}$ to the upper limit $S_{max}$.

5. Conclusion

As described above, the method of fabricating the TFT substrate 100 according to the present embodiment includes: forming the oxide semiconductor layer 140 above the substrate 100; forming the metal film 160 mainly comprising Cu above the substrate 100; forming the source electrode 160s and the drain electrode 160d by processing the metal film 160 in a predetermined shape; irradiating the source electrode 160s and the drain electrode 160d with nitrogen plasma after the forming of the source electrode 160s and the drain electrode 160d; exposing surfaces of a top and an end portion of each of the source electrode 160s and the drain electrode 160d with silane ($SiH_4$) gas after the irradiating; and forming the insulating layer 170 comprising an oxide on the source electrode 160s and the drain electrode 160d after the exposing.

By this method, the nitrogen plasma irradiation and the silane exposure are performed to form the Cu silicide film 160c at the surfaces of the top and the end portion of each of the source electrode 160s and the drain electrode 160d. As a result, the surfaces of the electrodes are modified. Therefore, the surfaces of the top and the end portion of each of the source electrode 160s and the drain electrode 160d are protected from plasma of nitrogen gas and the like used in the subsequent insulating layer forming process of forming the insulating layer 170. As a result, it is possible to reduce thermal migration caused from the surfaces of the top and the end portion. As a result, it is possible to decrease oxidation and resistance increase of the source electrode 160s and the drain electrode 160d, decrease a short circuit through the insulating layer 170, and eventually reduce insulation failure of the TFT by the simplified fabricating processes.

For example, it is also possible that, in the irradiating of the source electrode 160s and the drain electrode 160d with the nitrogen plasma, an integral power density N of the nitrogen plasma 160A produced from $N_2$ gas is set to be in a range from 0.5 J/$cm^2$ to 15 J/$cm^2$, inclusive, and that, in the exposing of the surfaces of the top and the end portion of each of the source electrode 160s and the drain electrode 160d with the $SiH_4$ gas 160B, a molecular incident amount S of the $SiH_4$ gas 160B is set to be in a range from 0.15 mol/$cm^2$ to 8.0 mol/$cm^2$, inclusive.

In the case where electrodes and/or lines of a TFT are pattern-processed by lithography, surface of a processed end portion becomes rough and silicidation is hardly obtained. In addition, as a TFT substrate becomes larger in size, the silicidation is less homogeneous in the surface. In contrast, if the nitrogen plasma irradiation process according to this embodiment is performed at the above-described $N_2$ plasma integral power density and the silane exposure process according to this embodiment is performed with the above-described $SiH_4$ molecular incident amount, it is possible to form a Cu silicide layer (cap layer) that is homogeneous in surface including the processed end portion.

For example, it is further possible that, in the exposing, the surfaces of the top and the end portion of each of the source electrode 160s and the drain electrode 160d are exposed with the $SiH_4$ gas 160B to form a Cu silicide film 160c at the surfaces of the top and the end portion of each of the source electrode 160s and the drain electrode 160d. Here, the Cu silicide film 160c has a thickness in a range from 9 nm to 70 nm, inclusive.

If the thickness of the Cu silicide film 160c is less than 9 nm, oxidation of the surfaces of the top and the end portion of each of the source electrode 160s and the drain electrode 160d progresses. As a result, color unevenness (cloudiness) occurs in the insulating layer 170 and homogeneous insulation properties cannot be obtained. On the other hand, if the thickness of the Cu silicide film 160c is greater than 70 nm, electrode resistance increases in accordance with the thickness increase of the Cu silicide film 160c. In contrast, if the thickness of the Cu silicide film 160c is set to have the above-described range, it is possible to form a Cu silicide layer (cap layer) that is homogeneous in surface including the processed end portion of each of the source electrode 160s and the drain electrode 160d.

For example, it is still further possible that, in the irradiating, the surfaces of the top and the end portion of each of the source electrode 160s and the drain electrode 160d are irradiated with the nitrogen plasma to be activated to facilitate silicidation of the surfaces of the top and the end portion in the exposing.

For example, it is still further possible that the method includes further irradiating the source electrode 160s and the drain electrode 160d with nitrogen plasma produced from $N_2$ gas. Here, the further irradiating is performed between the exposing and the forming of the insulating layer 170.

By this method, it is possible to fix the Cu silicide film 160c formed in the silane exposure process to the surfaces of the top and the end portion of each of the source electrode 160s and the drain electrode 160d. As a result, it is possible to cause the Cu silicide film 160c to be stable even in the subsequent insulating layer forming process of forming the insulating layer 170.

For example, it is still further possible that, in the forming of the insulating layer 170, the insulating layer 170 comprises a silicon oxide.

By this method, in the silane exposure process and the insulating layer forming process, the same silane-based gas can be used. Therefore, the silane exposure process and the insulating layer forming process can be performed sequentially. In other words, for example, after performing the silane exposure by using a plasma CVD device, the forming of the insulating layer 170 is performed without breaking a vacuum in a chamber of the plasma CVD device. Thereby, it is possible to decrease a risk of mixing impurities.

Other Embodiments

As above, the embodiment has been described as an exemplification of the technique disclosed in the present application. However, the technique according to the present disclosure is not limited to the foregoing embodiment, and can also be applied to embodiments to which a change, substitution, addition, or omission in the foregoing embodiment is executed as necessary.

Hereinafter, other embodiments are exemplified.

For example, in the foregoing embodiment, a metal film mainly including Cu is processed to be the source electrode 160s and the drain electrode 160d. However, the present disclosure is not limited to this example. The metal film may be processed to be, for example, the gate electrode 120. Furthermore, the metal film may be processed to be other lines formed above the TFT substrate. In these cases, by forming the Cu silicide film 160c at the surfaces of the top and the end portion of each of the electrodes and/or lines, it is possible to decrease oxidation and resistance increase of the electrodes and/or lines, decrease a short circuit through the insulating layer, and eventually reduce insulation failure of the TFT.

Although the TFT is a bottom-gate TFT in the foregoing embodiment, the TFT may be a top-gate TFT. Even if the TFT has a top-gale structure, it is possible to apply a metal film mainly including Cu to at least one of the gate electrode, the source electrode, the drain electrode, and the other lines.

Although it has been described in the foregoing embodiment that one nitrogen plasma irradiation process and one silane exposure process are performed between the electrode/line forming process and the insulating layer forming process, it is also possible to repeat the nitrogen plasma irradiation process and the silane exposure process a plurality of times between the electrode/line forming process and the insulating layer forming process.

Although plasma CVD is used as a method of forming the silicon oxide film in the foregoing embodiment, the method is not limited to this example. As the method of forming the silicon oxide film, sputtering, for example, is also possible.

Although it has been described in the foregoing embodiment that the $N_2O$ plasma treatment is used as an oxidation treatment on the gate insulating layer 120, the ES layer 150, and the insulating layer 170, the oxidation treatment is not limited to this example. An oxygen plasma treatment using oxygen gas ($O_2$) instead of $N_2O$ may be used. For example, if silane gas and oxygen gas are used as film-forming gasses for the silicon oxide film, an oxygen plasma treatment using oxygen gas allows a film-forming process and an plasma treatment to be sequentially performed in the same chamber.

As a result, it is possible to increase convenience in production, such as device simplification and low reduction.

Furthermore, the oxidation treatment may be not the plasma treatment but a gas treatment using oxidized gas or an annealing treatment of annealing at a predetermined temperature. Moreover, a relationship between a parameter for the oxidation treatment and a threshold value Vth for the TFT may be other than a linear relation.

Although, for example, each of the gate insulating layer 120, the ES layer 150, and the insulating layer 170 includes a silicon oxide film in the foregoing embodiment, the present disclosure is not limited to this example. For example, each of the gate insulating layer 120, the ES layer 150, and the insulating layer 170 may include an oxide film, such as an aluminum oxide film.

Although, for example, each of the gate insulating layer 120, the ES layer 150, and the insulating layer 170 has a single-layer structure in the foregoing embodiment, the structure is not limited to this example. Each of the gate insulating layer 120, the ES layer 150, and the insulating layer 170 may include two or more oxide films.

Furthermore, although the organic EL display device 10 is described in the foregoing embodiment as a display device including the TFT 100 for example, the TFT 100 according to the foregoing embodiment can also be used in other display devices including an active-matrix substrate, such as a liquid crystal display device, etc.

Although the organic EL display device 10 has been described in the foregoing embodiment as a display device including the TFT substrate 100, the thin-film semiconductor substrate according to the present disclosure may be a thin-film semiconductor substrate in which a thin-film semiconductor is not used as a channel layer of the TFT. For example, a semiconductor substrate including a stacked-layer diode including a thin-film semiconductor may be the thin-film semiconductor substrate according to the present disclosure.

Furthermore, display devices (display panels) such as the above-described organic EL display device 10 can be used as a flat panel display, and can be applied to various electronic devices having a display panel, such as television sets, personal computers, mobile phones, and so on. In particular, display devices (display panels) such as the above-described organic EL display device 10 are suitable for display devices having a large screen and high definition.

As described above, the embodiments are described as exemplifications of the technique according to the present disclosure. As such, the accompanying drawings and detailed description are provided for this purpose.

Therefore, the structural components described in the accompanying drawings and detailed description may include, not only structural components essential to solving the problem, but also structural elements that are not essential to solving the problem but are included in order to exemplify the aforementioned technique. As such, description of these non-essential structural components in the accompanying drawings and the detailed description should not be taken to mean that these non-essential structural elements are essential.

Furthermore, since the foregoing embodiments are for exemplifying the technique according to the present disclosure, various changes, substitutions, additions, omissions, and so on, can be carried out within the scope of the Claims or its equivalents.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The method of fabricating a thin-film semiconductor substrate according to the present disclosure can be used, for example, as a method of fabricating a thin-film semiconductor substrate including an oxide semiconductor, and a method of fabricating a display device, such as an organic EL display devices including a TFT substrates.

The invention claimed is:

1. A method of fabricating a thin-film semiconductor substrate including a thin-film semiconductor, the method comprising:
    forming a semiconductor layer including the thin-film semiconductor above a substrate;
    forming a metal film comprising Cu above the substrate;
    forming at least one of an electrode and a line by processing the metal film in a predetermined shape;
    irradiating an upward facing surface of the at least one of the electrode and the line with nitrogen plasma after the forming of the at least one of the electrode and the line;
    exposing the upward facing surface of the at least one of the electrode and the line with silane ($SiH_4$) gas after the irradiating; and
    forming an insulating layer comprising an oxide on the at least one of the electrode and the line after the exposing,
    wherein outermost portions of the upward facing surface of the at least one of the electrode and the line each have a tapered shape inclined from a normal direction of the substrate in a cross-sectional view, the outermost portions each being irradiated with the nitrogen plasma and exposed to the silane gas in the normal direction, and
    for the at least one of the electrode and the line, the insulating layer is formed only on the upward facing surface.

2. The method according to claim 1,
    wherein, in the irradiating of the at least one of the electrode and the line with the nitrogen plasma, an integral power density of the nitrogen plasma produced from $N_2$ gas is set to be in a range from 0.5 $J/cm^2$ to 15 $J/cm^2$, inclusive, and
    in the exposing of the upward facing surface of the at least one of the electrode and the line with the $SiH_4$ gas, a molecular incident amount of the $SiH_4$ gas is set to be in a range from 0.15 $mol/cm^2$ to 8.0 $mol/cm^2$, inclusive.

3. The method according to claim 2,
    wherein, in the exposing, the upward facing surface of the at least one of the electrode and the line is exposed with the $SiH_4$ gas to form a Cu silicide film at the upward facing surface of the at least one of the electrode and the line, the Cu silicide film having a thickness in a range from 9 nm to 70 nm, inclusive.

4. The method according to claim 1,
    wherein in the irradiating, the upward facing surface of the at least one of the electrode and the line is irradiated with the nitrogen plasma to be activated to facilitate silicidation of the upward facing surface in the exposing.

5. The method according to claim 1, further comprising:
    further irradiating the upward facing surface of the at least one of the electrode and the line with nitrogen plasma produced from $N_2$ gas, the further irradiating being performed between the exposing and the forming of the insulating layer.

6. The method according to claim 1,
    wherein, in the forming of the insulating layer, the insulating layer comprises a silicon oxide.

7. The method according to claim 1,
    wherein the semiconductor layer comprises an oxide semiconductor.

8. The method according to claim 1,
    wherein, in the exposing, a molecular incident amount of the $SiH_4$ gas to the outermost portions of the upward facing surface of the at least one of the electrode and the line is set to be at least 0.15 $mol/cm^2$.

9. The method according to claim 8,
    wherein the molecular incident amount is a product of a molecular incident frequency and a treatment period,
    a lower limit of the treatment period is 250 seconds, and
    a lower limit of the molecular incident frequency is 0.153 $mol/cm^2$.

10. The method according to claim 9,
    wherein an upper limit of the treatment period is 13377 seconds, and
    an upper limit of the molecular incident frequency is 8.0 $mol/cm^2$.

11. The method according to claim 1,
    wherein, in the irradiating, an integral power density of the nitrogen plasma produced from $N_2$ gas is set to be at least 0.5 $J/cm^2$ to 15 $J/cm^2$.

12. The method according to claim 1,
    wherein the at least one of the electrode and the line includes a middle portion between the outermost portions, the middle portion being perpendicular to the normal direction.

13. A method of fabricating a thin-film semiconductor substrate including a thin-film semiconductor, the method comprising:
    forming a semiconductor layer including the thin-film semiconductor above a substrate;
    forming a metal film comprising Cu above the substrate;
    forming at least one of an electrode and a line by processing the metal film in a predetermined shape;
    irradiating an upward facing surface of the at least one of the electrode and the line with nitrogen plasma after the forming of the at least one of the electrode and the line;
    exposing the upward facing surface of the at least one of the electrode and the line with silane ($SiH_4$) gas after the irradiating; and
    forming an insulating layer comprising an oxide on the at least one of the electrode and the line after the exposing,
    wherein outermost portions of the upward facing surface of the at least one of the electrode and the line each have a tapered shape inclined from a normal direction of the substrate in a cross-sectional view, the outermost portions each being irradiated with the nitrogen plasma and exposed to the silane gas in the normal direction, and
    the upward facing surface of the at least one of the electrode and the line is the only surface of the at least one of the electrode and the line irradiated with the nitrogen plasma.

14. A method of fabricating a thin-film semiconductor substrate including a thin-film semiconductor, the method comprising:
- forming a semiconductor layer including the thin-film semiconductor above a substrate;
- forming a metal film comprising Cu above the substrate;
- forming at least one of an electrode and a line by processing the metal film in a predetermined shape;
- irradiating an upward facing surface of the at least one of the electrode and the line with nitrogen plasma after the forming of the at least one of the electrode and the line;
- exposing the upward facing surface of the at least one of the electrode and the line with silane ($SiH_4$) gas after the irradiating; and
- forming an insulating layer comprising an oxide on the at least one of the electrode and the line after the exposing,
- wherein outermost portions of the upward facing surface of the at least one of the electrode and the line each have a tapered shape inclined from a normal direction of the substrate in a cross-sectional view, the outermost portions each being irradiated with the nitrogen plasma and exposed to the silane gas in the normal direction, and
- the upward facing surface of the at least one of the electrode and the line is the only surface of the at least one of the electrode and the line exposed to the silane gas.

* * * * *